(12) United States Patent
Bold et al.

(10) Patent No.: US 6,289,489 B1
(45) Date of Patent: Sep. 11, 2001

(54) METHOD AND APPARATUS FOR AUTOMATICALLY CROSS-REFERENCING GRAPHICAL OBJECTS AND HDL STATEMENTS

(76) Inventors: Stephen L. Bold; Mark W. P. Dane, both of Rivergate Newbury Business Park, London Rd., Newbury RE14 2QB; Michael J. Reynolds, 2 Kiln Ciose, Hermitage, Newbury, Berks RG18 9TQ; Mark Paraskeva, 9 Stanbrook Close, S. Bradfield, Berks; James Stewart, Rivergate Newbury Business Park, London Rd., Newbury, Berkshire RE14 2QB, all of (GB)

(*) Notice: Subject to any disclaimer, the term of this patent is extended or adjusted under 35 U.S.C. 154(b) by 0 days.

(21) Appl. No.: 09/256,329
(22) Filed: Feb. 23, 1999
(51) Int. Cl.⁷ ..................................................... G06F 17/50
(52) U.S. Cl. .................................................................. 716/1
(58) Field of Search ..................................... 716/1, 18, 19

(56) References Cited

U.S. PATENT DOCUMENTS 5,623,418 * 4/1997 Rostoker et al. ......................... 716/1

* cited by examiner

Primary Examiner—Trong Phan
(74) Attorney, Agent, or Firm—Columbia IP Law Group, PC

(57) ABSTRACT

The present invention beneficially provides a method and apparatus for cross-referencing graphical objects and hardware description language (HDL) statements. According to one aspect of the present invention, a cross-referencing record is automatically generated to map graphical objects to corresponding HDL statements. According to a second aspect of the invention, a request is received to cross-reference a HDL statement and a graphical object. Based on the request, the cross-referencing record is accessed to identify a target of the request.

20 Claims, 10 Drawing Sheets

FIG. 6

| 600 | LIBRARY MAPPING FILE |
|---|---|
| 610 | [GRAPHICS _ LIBRARY] |
| 620 | TIMER _ VHDL = D:/DESIGNS/TIMER_VHDL/GRC |
| 630 | COUNTER _ VLOG = D:/DESIGNS/COUNTER_VLOG/GRC |
| 640 | [GENERATED _ TEXT _ LIBRARY] |
| 650 | TIMER _ VHDL = D: / DESIGNS / TIMER _ VHDL / VHD |
| 660 | COUNTER _ VLOG = D: / DESIGNS / COUNT _ VLOG / VLG |

FIG. 7

| 700 | D: / DESIGNS / TIMER _ VHDL |
|---|---|
| 710 | GRC |
| 720 | TIMER |
| 730 | VIEW1.BD |
| 740 | VIEW2.SD |
| 750 | VIEW3.FD |
| 760 | VIEW4.TT |
| 765 | XRF |
| 770 | TIMER _ VIEW1. XRF |
| 775 | TIMER _ VIEW2. XRF |
| 780 | VHD |
| 785 | TIMER - VIEW1. VHD |
| 790 | TIMER - VIEW2. VHD |

FIG. 8

| | |
|---|---|
| 800 | DESIGN TIMER |
| 810 | VIEW VIEW1. BD |
| 820 | GRAPHIC 154 1 |
| 830 | GRAPHIC 155 22 |
| 840 | GRAPHIC 156 34 |

METHOD AND APPARATUS FOR
AUTOMATICALLY CROSS-REFERENCING
GRAPHICAL OBJECTS AND HDL
STATEMENTS

FIELD OF THE INVENTION

The present invention pertains to the field of hardware description languages (HDLs). More particularly, this invention relates to the art of cross-referencing HDL statements and corresponding graphical objects.

BACKGROUND

Hardware description languages (HDLs), such as Verilog and very high speed integrated circuit (VHSIC) hardware description language (VHDL), are widely used to develop integrated circuits. HDLs can provide functional and/or structural descriptions of virtually any circuit design in a textual format similar to a high level programming language such as C++ or Pascal. From a HDL representation, a circuit design can be simulated or synthesized using a wide variety of commonly available software and hardware products.

Although HDLs are very powerful tools, the learning curve can be long. Memorizing syntax, managing files, and debugging designs can be incredibly time consuming and frustrating for even experienced users. Users may also have trouble communicating design intent, and modifying existing designs, based on purely textual representations.

Graphical entry of HDL designs can improve the learning curve as well as make design intent easier to communicate to others. In a graphical entry environment, flowcharts, block diagrams, state diagrams, etc. can be created to describe a circuit at a higher level of abstraction. From graphical objects, HDL statements can be generated automatically and used for simulation and/or synthesis.

Graphical entry, however, adds a layer of complexity to the design flow. Although many users prefer to work in a graphical environment, the added layer of complexity can detract from the advantages afforded by graphical entry under certain circumstances, such as debugging or modifying a design.

For example, simulation is usually based on a HDL textual representation. In which case, error messages generated during simulation may refer to particular HDL statements using file pathnames and line numbers. Since the HDL text statements are automatically generated from graphical objects, an inexperienced user may not be able to edit a design directly from the HDL textual representation. And, even if a user is able to edit the HDL text, the graphical representation would no longer accurately represent the design being simulated. For either reason, a user may choose to correct the error using the graphical representation. In which case, the user may first have to manually determine which of potentially thousands of graphical objects corresponds to a particular error message before correcting the error.

Whenever a user has to spend time cross-referencing generated HDL statements to a graphical object or vice versa, advantages gained by designing in a graphical environment may be diminished. Therefore, the usability and productivity of graphical entry may be increased by providing an improved method and apparatus to cross-reference graphical objects and HDL statements.

SUMMARY OF THE INVENTION

The present invention beneficially provides a method and apparatus for cross-referencing graphical objects and hardware description language (HDL) statements. According to one aspect of the present invention, a cross-referencing record is automatically generated to map graphical objects to corresponding HDL statements. According to a second aspect of the invention, a request is received to cross-reference a HDL statement and a graphical object. Based on the request, the cross-referencing record is accessed to identify a target of the request.

BRIEF DESCRIPTION OF THE DRAWINGS

Examples of the present invention are illustrated in the accompanying drawings. The accompanying drawings, however, do not limit the scope of the present invention. Like references in the drawings indicate similar elements.

FIG. 6 illustrates one embodiment of a library mapping file.

FIG. 7 illustrates one embodiment of a directory structure.

FIG. 8 illustrates one embodiment of a cross-referencing file.

DETAILED DESCRIPTION

In the following detailed description, numerous specific details are set forth in order to provide a thorough understanding of the present invention. However, those skilled in the art will understand that the present invention may be practiced without these specific details, that the present invention is not limited to the depicted embodiments, and that the present invention may be practiced in a variety of alternate embodiments. In other instances, well known methods, procedures, components, and circuits have not been described in detail.

Figure 1:
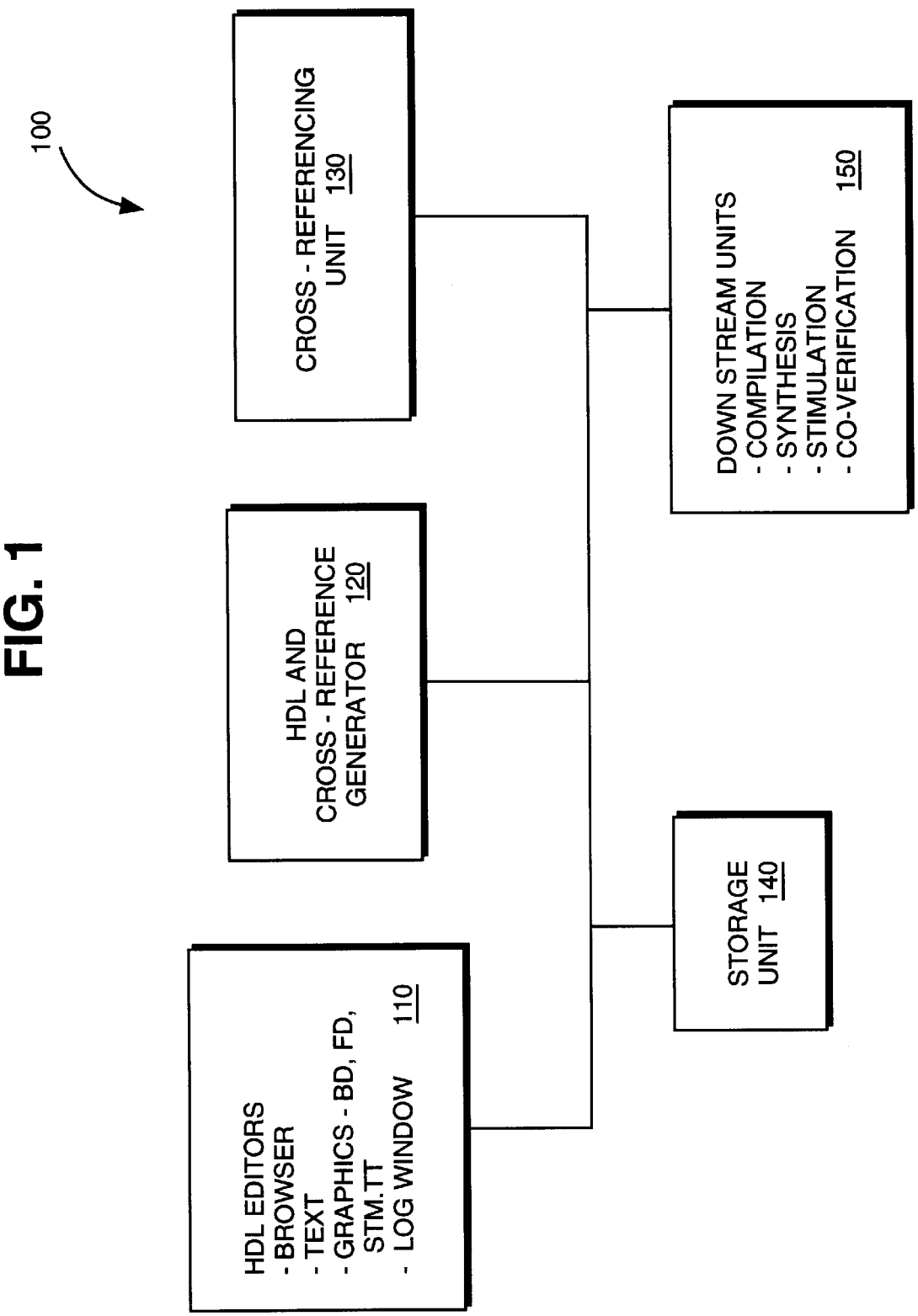
FIG. 1 illustrates one embodiment of a HDL design environment according to the teachings of the present invention.

FIG. 1 illustrates a block diagram of one embodiment of a hardware description language (HDL) design environment 100. Except for the cross-referencing features discussed below, HDL design environment 100 is intended to represent any number of HDL-based graphical entry environments. According to the teachings of the present invention however, HDL environment 100 beneficially provides for automatic cross-referencing between HDL statements and corresponding graphical objects. In various embodiments, cross-referencing can be used to identify graphical objects corresponding to generated HDL statements, identify graphical objects based on messages from downstream applications which refer to HDL statements, identify generated HDL statements based on a graphical object, and view and control simulation or synthesis as it progresses in a graphical representation. That is, from almost any point in the HDL design flow, including downstream compilation, simulation, synthesis, and/or co-verification, specific graphical objects and HDL text statements comprising a circuit design may be quickly and conveniently identified, viewed, and edited.

HDL editors 110 represent a wide variety of user interfaces, including graphics and text editors, for creating, viewing, modifying, and monitoring HDL-based circuit designs. Examples of some user interfaces within HDL editors 110 are discussed below with respect to FIGS. 4 and 5.

Generator 120 represents any of a number of HDL generators. Based on a graphical representation of a circuit design, generator 120 automatically generates one or more HDL text files representing the function and/or structure of the circuit as specified in the graphical representation. According to the teachings of the present invention, generator 120 also generates a cross-referencing record to map graphical objects in the graphical representation to generated HDL statements in the HDL text files. An example of creating a cross-referencing record is discussed below with respect to FIGS. 2, 4, and 6–8.

The graphical representations, generated HDL files, and cross-referencing records can be stored in storage unit 140. Storage unit 140 represents any of a number of data storage devices. Storage unit 140 may represent main memory in a computer system, a cache memory associated with a microprocessor, a non-volatile storage device such as Flash memory, etc.

Downstream units 150 represent any of a number of HDL-based hardware and/or software products for compilation, synthesis, simulation, co-verification, etc. In one design flow embodiment, after a circuit design is graphically entered using HDL editors 110, generator 120 generates HDL text that is compatible with one or more of downstream units 150. Based on the HDL text, the circuit design can be compiled and then simulated, synthesized, and/or co-verified. An example of cross-referencing a compilation error to a graphical object is discussed below with respect to FIGS. 5–8.

According to the teachings of the present invention, cross-referencing unit 130 receives requests to cross-reference graphical objects to HDL statements or vice versa. In one embodiment, requests are received from HDL editors 110, generator 120, and downstream units 150. Cross-referencing unit 130 accesses a cross-referencing record and identifies a target graphical object or HDL statement based on the request. Cross-referencing unit 130 may also activate an appropriate editor within HDL editors 110 to display the target. Examples of cross-referencing are discussed below with respect to FIGS. 3–8.

The example embodiments discussed below are based on a particular implementation of a design flow. Those skilled in the art, after reading the description herein, will recognize that the present invention is not limited to the particular implementation. Before moving on to the example embodiments however, a number of implementation-specific design flow details will be discussed to provide context for the examples.

Graphics editors in HDL editors 110 may include a state machine editor, a flowchart editor, a block diagram editor, a truth table editor, etc. The various graphics editors can be used to describe a circuit in several different ways. Graphical representations can also be mixed and matched and arranged in hierarchies. For instance, using a block diagram editor, a designer can create a block diagram representing the interrelation of several functional blocks within a circuit. The function of each block in the block diagram may be defined using a truth table editor to specify output values for every possible combination of input values.

HDL text segments may also be included within graphical representations. For instance, if a particular output, or the function of a particular state or transition, can be defined with a few lines of HDL, the HDL segments can be written into the graphical representation. Then, when HDL statements are generated based on the graphical representation, the HDL segments from the graphical representation can be incorporated directly into the generated HDL.

In the examples below, the hierarchy of graphical and textual representations is described using the terms "library," "design unit," and "view." A library is a collection of one or more design units, and a design unit comprises one or more views. A design unit represents some functionality that can be reused. A view can be either a specification or an implementation of the functionality of a design unit. Views may be used in the alternative to represent a design unit. For instance, a design unit may include a flowchart view, a block diagram view, and a truth table view.

Those skilled in the art will be familiar with the terms library, design unit, and view as they are used with respect to VHDL. With respect to the present invention, a graphical diagram and HDL generated based on the graphical diagram are both representations of a single "view" in terms of VHDL. As a shorthand notation however, a graphical diagram will be referred to herein as a graphics, or graphical, "view" and HDL generated based on the graphical diagram will be referred to herein as a HDL textual "view." A graphical view is comprised of graphical objects, such as blocks in a block diagram or state in a state diagram. A HDL textual view is comprised of HDL statements generated based on the graphical objects.

A text editor in HDL editors 110 may include any of a number of text editors which include functions such as text selecting, highlighting, and line number locating. For instance, as discussed below for one embodiment, one or more HDL statements may be selected with a text editor and a message sent to cross-referencing unit 130 to request corresponding graphical objects. Conversely, cross-referencing unit 130 may invoke a text editor and instruct it to display a particular text file, locate one or more lines of HDL statements within the text file, and highlight the lines.

Figure 2:
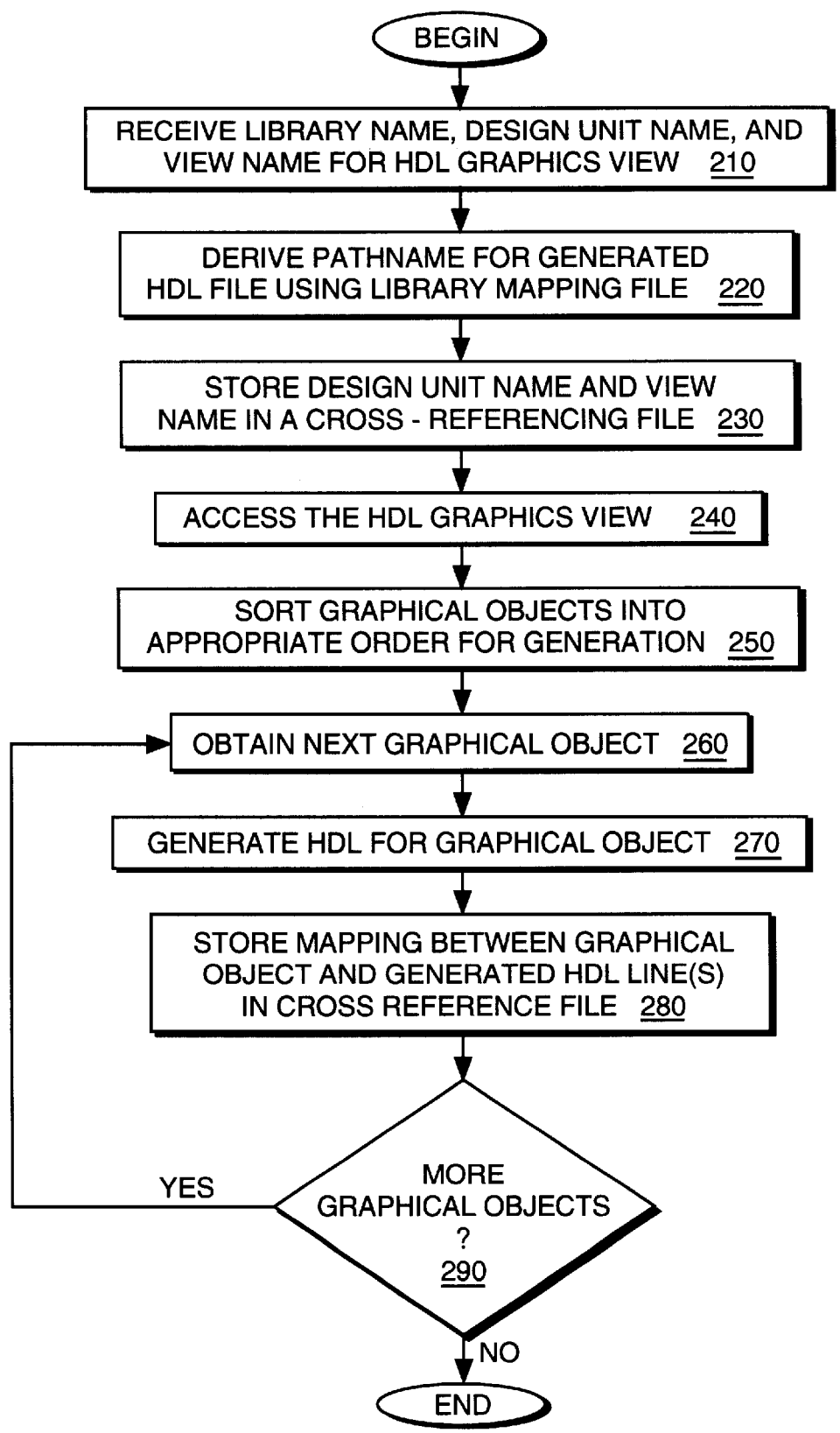
FIG. 2 illustrates one embodiment of a process to generate a cross-referencing record.

FIG. 2 illustrates one embodiment of a process for generating a cross-referencing record. In general, generator 120 receives one or more graphical objects and automatically generates a cross-referencing record to map the graphical objects to corresponding HDL statements. The illustrated embodiment includes a number of additional implementation-specific details.

In the embodiment illustrated in FIG. 2, generating the cross-referencing record is performed in parallel with HDL generation. That is, whenever generator 120 is called upon to generate a HDL text view, generator 120 automatically generates a cross-referencing record at the same time.

In step 210, generator 120 receives a library name, design unit name, and graphics view name for a particular HDL graphics view. The library, design unit, and graphics view are received as part of a request to generate a HDL text view. In response to the request, generator 120 uses a library mapping file to derive a pathname for the HDL text to be generated based on the graphics view in step 220.

FIG. 6 illustrates one embodiment of a library mapping file. Library mapping file 600 has a graphics section 610 and a generated text section 640. The graphics section 610 includes two libraries and a pathname to a graphics directory for each library, 620 and 630. The generated text section 640 includes the same two libraries and a pathname to a text directory for each library, 650 and 660. Based on a library name, library mapping file 600 maps a graphics directory pathname to a generated text directory pathname. In which case, based on the library name, a pathname for the HDL text can be derived. Access to the library mapping file is the first part of the cross-referencing record.

FIG. 7 illustrates one embodiment of a directory structure 700 corresponding to the library TIMER_VHDL listed in FIG. 6. Directory structure 700 includes a graphics directory 710 for the library and a generated text directory 780. Graphics directory 710 includes a directory 720 for a design unit. If the library included more design units, the graphics directory could include additional design unit directories.

Design unit directory 720 includes four graphics views, 730–760, of the design unit. VIEW1.BD is a block diagram view of the design unit TIMER as indicated by the suffix .BD, VIEW2.SD is a state diagram view of TIMER as indicated by the suffix .SD, etc.

Generated text directory 780 includes two HDL text views, 785 and 790. The HDL text views 785 and 790 are named based on the design unit name and graphics view name from which they were generated. For instance, TIMER_VIEW1.VHD is a HDL text view corresponding to design unit TIMER and view VIEW1.BD generated in VHDL, as opposed to Verilog, as indicated by the suffix .VHD.

Returning to FIG. 2, the design unit name and view name are stored in a cross-referencing file in step 230. The cross-referencing file is the second part of the cross-referencing record. One embodiment of a cross-referencing record is illustrated in FIG. 8. The cross-referencing record identifies the design unit and graphics view to which it applies in lines 800 and 810.

In step 240 of FIG. 2, the HDL graphics view is accessed and, in step 250, graphical objects in the view are sorted into an appropriate order for HDL generation. In step 260, the first graphical object is obtained. HDL corresponding to the graphical object is generated in step 270. In step 280, an entry is stored in the cross-referencing file to map a unique identifier of the graphical object to the line number, or line numbers, of corresponding HDL statements generated and stored in the HDL text view. Every graphical object within the HDL graphics view has a unique identifier. In step 290, if more graphical objects remain in the graphics view, the process loops back. Otherwise the process ends.

As shown in the embodiment of FIG. 8, lines 820 to 840 are cross-referencing entries identified by the word GRAPHIC. Each entry includes a unique identifier for a graphical object and a starting line number corresponding to the graphical object in the HDL text view. Since lines are numbered sequentially, only a starting line number is needed. All of the lines in the HDL text view from the starting line number in an entry to one less than the starting line number in the next entry are presumed to correspond to the graphical object.

In one embodiment, there is one cross-referencing file for each HDL text view and the cross-referencing file is stored in a directory with the corresponding graphics view and named according to the corresponding HDL text view. As shown in FIG. 7, graphics directory 710 includes a directory 765 for storing cross-referencing files. In the illustrated embodiment, directory 765 is recognized in the graphics file by the name XRF, and cross-referencing files 770 and 775 are recognized as cross-referencing files by the suffix .XRF.

Figure 3A:
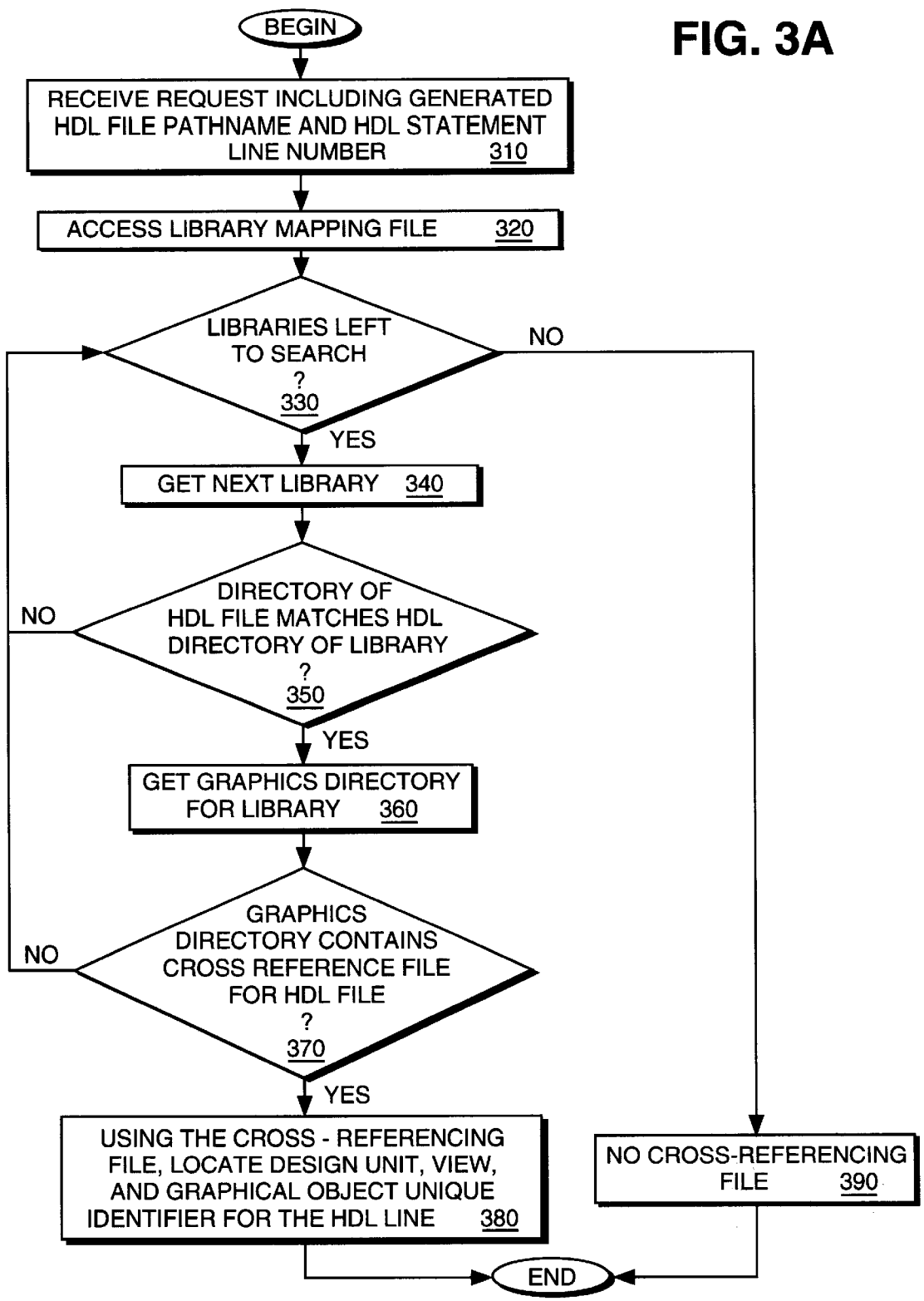
FIGS. 3A and 3B illustrate embodiments of cross-referencing graphical objects and HDL statements based on a cross-referencing record.
Figure 3B:
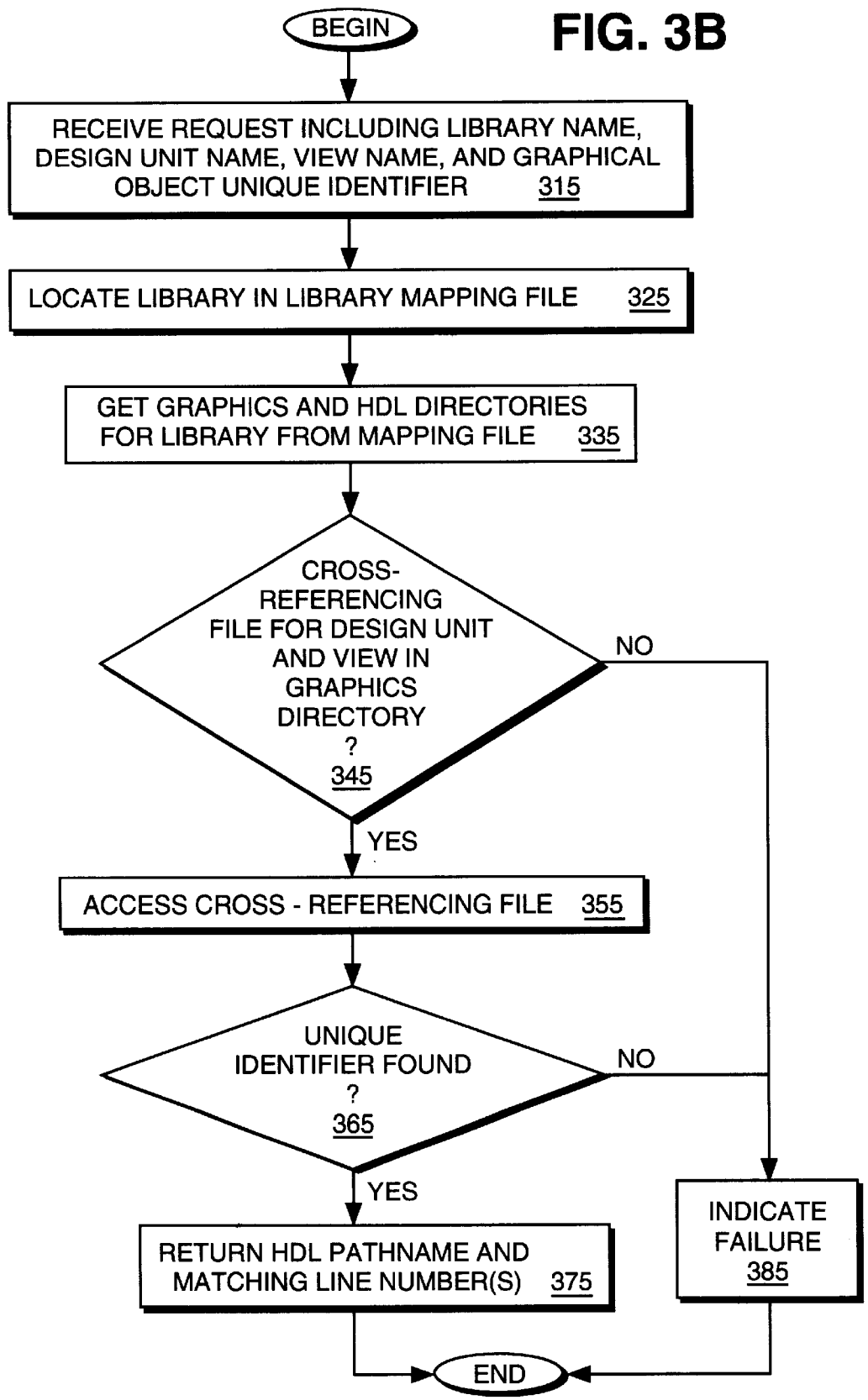

FIGS. 3A and 3B illustrate embodiments of processes used by cross-referencing unit 130. In general cross-referencing unit 130 receives a request to cross-reference, accesses a cross-referencing record, and identifies a target of the request. The illustrated embodiments include a number of additional implementation-specific details. The request may come from HDL editors 110, generator 120, or downstream units 150.

In FIG. 3A, in step 310, a cross-referencing request is received including a pathname for a HDL text view and a line number for a HDL statement within the HDL text view. In step 320, a library mapping file, such as the one shown in FIG. 6, is accessed. If the HDL text view was generated based on a graphics view, then the library mapping file should map the text view to the graphics view, and a cross-referencing file should have been created. So, in steps 330 to 350, the library mapping file is searched for a library corresponding to the HDL file pathname. Step 330 determines if any libraries remain in the mapping file to be searched. If no libraries remain, then the text view must not correspond to a graphics view. In which case, in step 390, no cross-referencing file is found and the process ends. Otherwise, in step 340, a library is selected.

The directory pathname for the HDL text view is compared to the pathname associated with the library name in step 350. For instance, in the library mapping file shown in FIG. 6, the HDL text view pathname is compared to the pathname on the right side of the equals sign for a given library name. If the pathnames match, then the library name has been located and the graphics directory pathname can be quickly identified in step 360. If the pathnames do not match in step 350 however, the process returns to step 330. In one embodiment, only the generated text section of the library mapping file is searched.

In step 370, a matched graphics directory is searched for a cross-referencing file corresponding to the HDL text view. As discussed above, if the cross-referencing file is stored in the graphics directory and named for the HDL text view, the cross-referencing file can be located by comparing the names of the cross-referencing files to the name of the HDL text view. If no matching cross-referencing file is found, the process returns to step 330. Otherwise, a matching cross-referencing file is used to locate the design unit and view in the graphics directory corresponding to the HDL text view. For instance, in the embodiment of FIG. 8, the design unit name and view name are stored in the cross-referencing file. Since the graphics directory was already located based on the library mapping file, the graphics view can be located using the design unit name and view name.

The cross-referencing file also contains entries mapping graphical objects to HDL statements. Based on the line number of the HDL statement from the cross-referencing request, the corresponding graphical object can be located. As discussed above for the cross-referencing file shown in FIG. 8, entries map unique identifiers for graphical objects to a first line of HDL statements generated based on the respective graphical objects. In which case, based on the line number from the cross-referencing request, a specific graphical object can be located in step 380.

In FIG. 3B, in step 315, a cross-referencing request is received including a library name, design unit name, view name, and unique identifier for a graphical object. In step 325, the library mapping file is accessed and the library is located in the file. From the library mapping file, in step 335, pathnames for graphics directories and HDL directories for the library are obtained. In step 345, the graphics directory is searched for a cross-referencing file corresponding to the graphics view. As discussed above with respect to FIG. 8, the cross-referencing file can be located by accessing each file and reading the design unit name and view name stored in the first two lines of the file. Alternately, the cross-referencing file could be located using a name convention if, for instance, the cross-referencing file is named for the design unit name and view name.

In step 355, the cross-referencing file is accessed to search entries. If the unique identifier of the graphical object from the cross-referencing request is found in an entry in step 365, the process returns the corresponding HDL statement line numbers from the cross-referencing file as well as the HDL text view pathname.

Those skilled in the art will recognize that any combination of one or more files, directory structures, naming conventions, relational databases, etc. could be used to create a cross-referencing record. For instance, in one alternate embodiment, the cross-referencing record could be a single file which contains a data structure matching graphical objects to HDL statements using entire pathnames.

Figure 4:
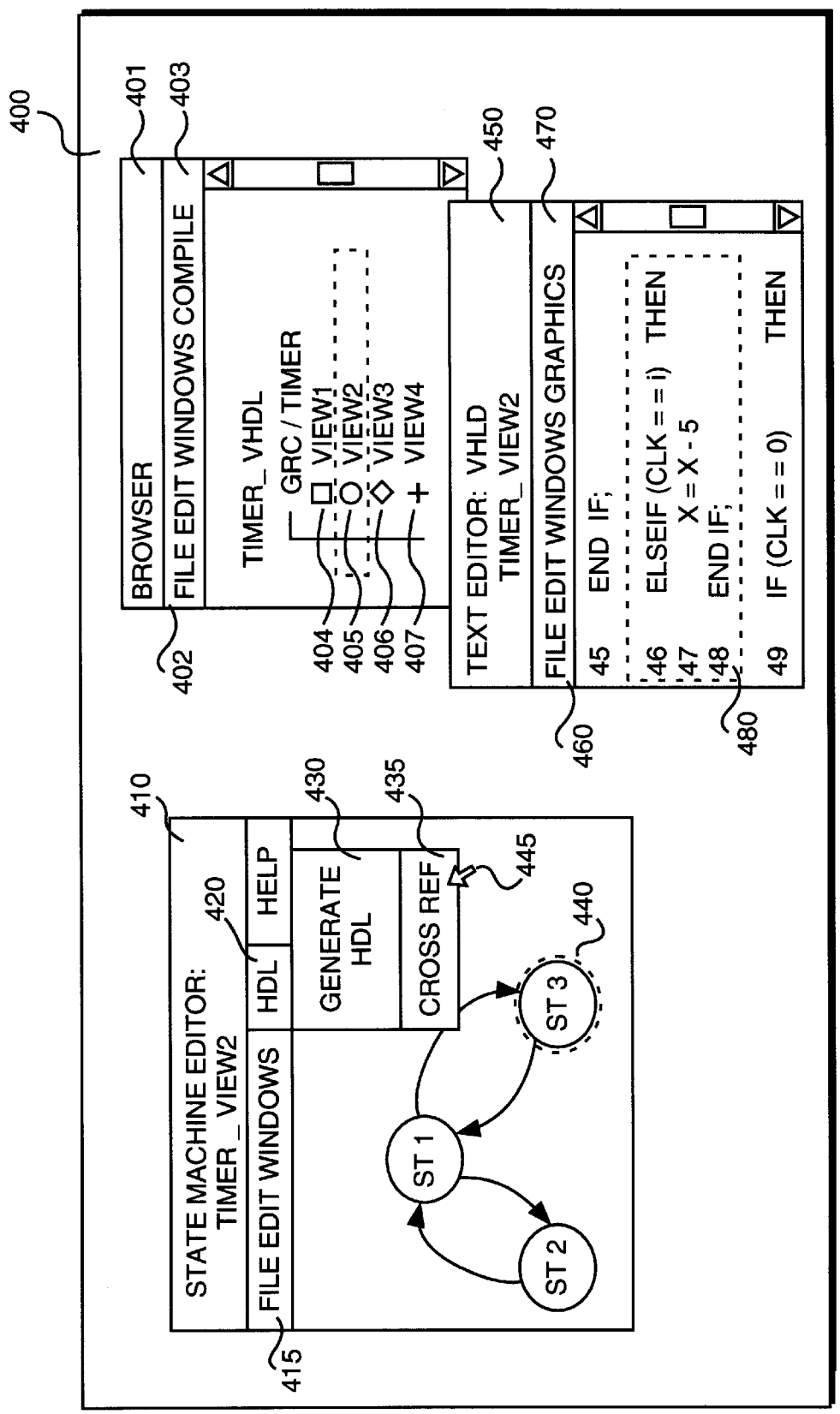
FIG. 4 illustrates one embodiment of cross-referencing using three HDL editor user interfaces.
Figure 5:
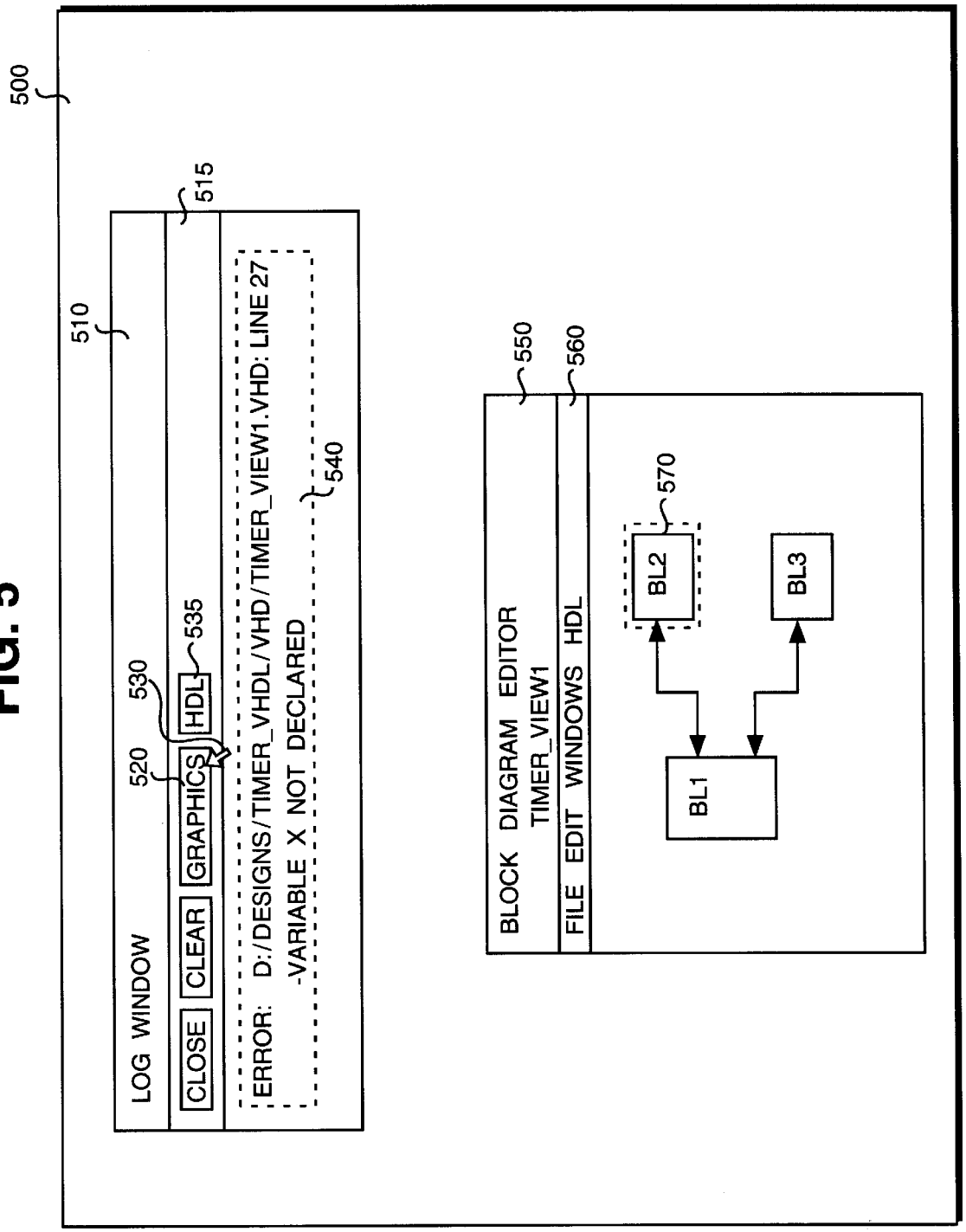
FIG. 5 illustrates one embodiment of cross-referencing from a log window message to a HDL editor.

FIGS. 4 and 5 illustrate examples of various embodiments of the present invention. In FIG. 4, display device 400 includes browser 401, state machine editor 410, and text editor 450. All three windows are among the user interfaces provided by HDL editors 110 from FIG. 1. Each window includes a menu bar, 402, 415, and 460, which includes a number of common menus such as file, edit, and windows. Menu bar 415 also includes HDL menu 420. Within HDL menu 420 is a generate HDL command 430. If a user selects the generate HDL command with cursor 445, state machine editor 410 sends a message to generator 120 to generate HDL and a cross-referencing record as discussed above with respect to FIG. 2. The message includes the library name, design unit name, and view name for the graphics view displayed in window 410. The corresponding HDL text view is displayed in text editor 450.

HDL menu 420 also includes cross-reference command 435. In the illustrated embodiment, state machine editor 410 is displaying a state machine view of timer_view2. State 440 has been highlighted and cross-reference command 435 has been selected with cursor 445. Using a process such as the one described above with respect to FIG. 3B, cross-referencing unit 130 identifies a set of HDL statements 480 corresponding to state 440 and displays them in text editor 450. Lines 46–48, which correspond to state 440, are designated in the text view. Any number of command formats could be used to instruct text editor 450 to locate lines 46–48, and any number of methods could be used to designate the lines. For instance, the lines could be highlighted, they could flash in a different color font, they could be displayed in italics, etc.

Text editor 450 also includes a graphics menu 470. Graphics menu 470, like HDL menu 420, could include a cross-reference menu option. In which case, a user could select one or more lines by highlighting them, and select the cross reference command to view the corresponding graphical object in state machine window 410 using a process such as the one described above with respect to FIG. 3A.

Browser 401 allows a user to brows through various libraries and design units. From browser 401, for example, a user could double-click on a view in order to activate the appropriate editor and display the selected view. In the illustrate embodiment, views are listed with an icon representing the view format. For instance, 404 is a block diagram view, 405 is state diagram view, 406 is a flow chart view, and 407 is a truth table view. In the illustrated embodiment, the state diagram shown in window 410 may have been brought up by double clicking on 405.

Menu bar 402 of Browser 401 also includes a compile menu 403. Compile menu 403 may be used to invoke any of a number of HDL downstream units for compilation, simulation, synthesis, co-verification, etc. For instance, view 405 may be selected from the browser window followed by a menu command from compile menu 403 to compile view 405.

FIG. 5 illustrates an example of cross-referencing based on a message from generator 120 or downstream units 150. Log window 510 and block diagram editor 550 appear on display device 500. One or more log windows 510 may be opened on display device 500 to log the process of generator 120 and/or downstream units 150 by displaying any error, warning, or information messages. For instance, if generator 120 encounters an error in a HDL segment included in a graphics view, generator 120 may provide an error message referring to a line number in the HDL text view generated based on the graphics views. Similarly, downstream units 150 may generate various error, warning, and informational messages.

Log window 510 includes a command bar 515. Command bar 515 includes various command buttons such as buttons to close and clear the log window. Command bar 515 also includes graphics command 520 and HDL command 535.

In the illustrated embodiment, log window 510 includes an error message 540 which has been selected by a user. When graphics command 520 is actuated with cursor 530, cross-referencing unit 130 receives a request to cross reference the HDL statement indicated by error message 540 with the corresponding graphical object. As discussed above with respect to FIG. 3A, the pathname and line number included in error message 540 can be used to identify the corresponding graphical object and graphics view.

The cross-referencing file for design unit TIMER, view VIEW1, is illustrated in FIG. 8. The line number indicated by error message 540 is line 27. As discussed above, each entry only includes the starting line number. In which case, cross-referencing unit 130 can scan the entries in the cross-referencing file until it finds an entry having a line number greater than 27. That would be entry 840 in the illustrated embodiment. Then, cross-referencing unit 130 can identify the target entry as the previous entry, or entry 830, which corresponds to lines starting with 22 and ending with 33. In which case, the target unique identifier corresponding the graphical object is 155.

Based on the target library name, design unit name, graphics view name, and unique identifier, cross-referencing unit 130 can activate the appropriate editor, instruct the editor to display the target graphical object, and designate the target graphical object in the display. As shown in block diagram editor 550, timer_view1 is displayed and block 570, which corresponds to the HDL statement indicated in error message 540, is designated. In more complex graphical views, the editor may center and zoom in on the target graphical object, highlight the target graphical object, etc. The graphical object could be designated in any number of ways.

The HDL statement indicated by error message 540 could also be displayed in a text editor window similar to window 450 of FIG. 4 either by actuating HDL command 535 or using menu bar 560 to select a cross-reference command similar to cross-reference command 435 in FIG. 4.

Numerous cross-referencing functions can be performed using the various embodiments of the present invention, including the embodiments described above. For instance, simulation break points can be set from a graphics view. Simulation break points are usually points of interest to a user at which he or she wants the simulator to pause or provide certain information. For instance, a user may want the simulator to report various state information whenever a particular transition occurs in a state diagram. Rather than manipulating the HDL text directly to report the desired information at the desired time, the user can select a graphical object corresponding to the transition and enter the break point in the HDL from the graphical representation. The state information may be displayed as informational messages in the simulation log window. Conversely, a user could set a breakpoint in HDL text and see a corresponding symbol appear in the graphics.

In another example, a simulator may be instructed to output line numbers as they are executed. In which case, the output stream could be used to designate graphical objects in a graphics view as the corresponding lines of HDL are executed. In this way, a user could watch a simulation as it progresses. A break point could also be set at various graphical objects so that simulation could be paused to allow a user time to track changes. Those skilled in the art, after having read the forgoing, will recognize that numerous additional applications of the present invention are possible.

In one embodiment of a graphical entry environment, graphics views can be automatically generated based on HDL text views. In which case, a procedure for generating a cross-referencing record similar to that described above with respect to FIG. 2 could be used to record entries as graphical objects are generated.

Figure 9:
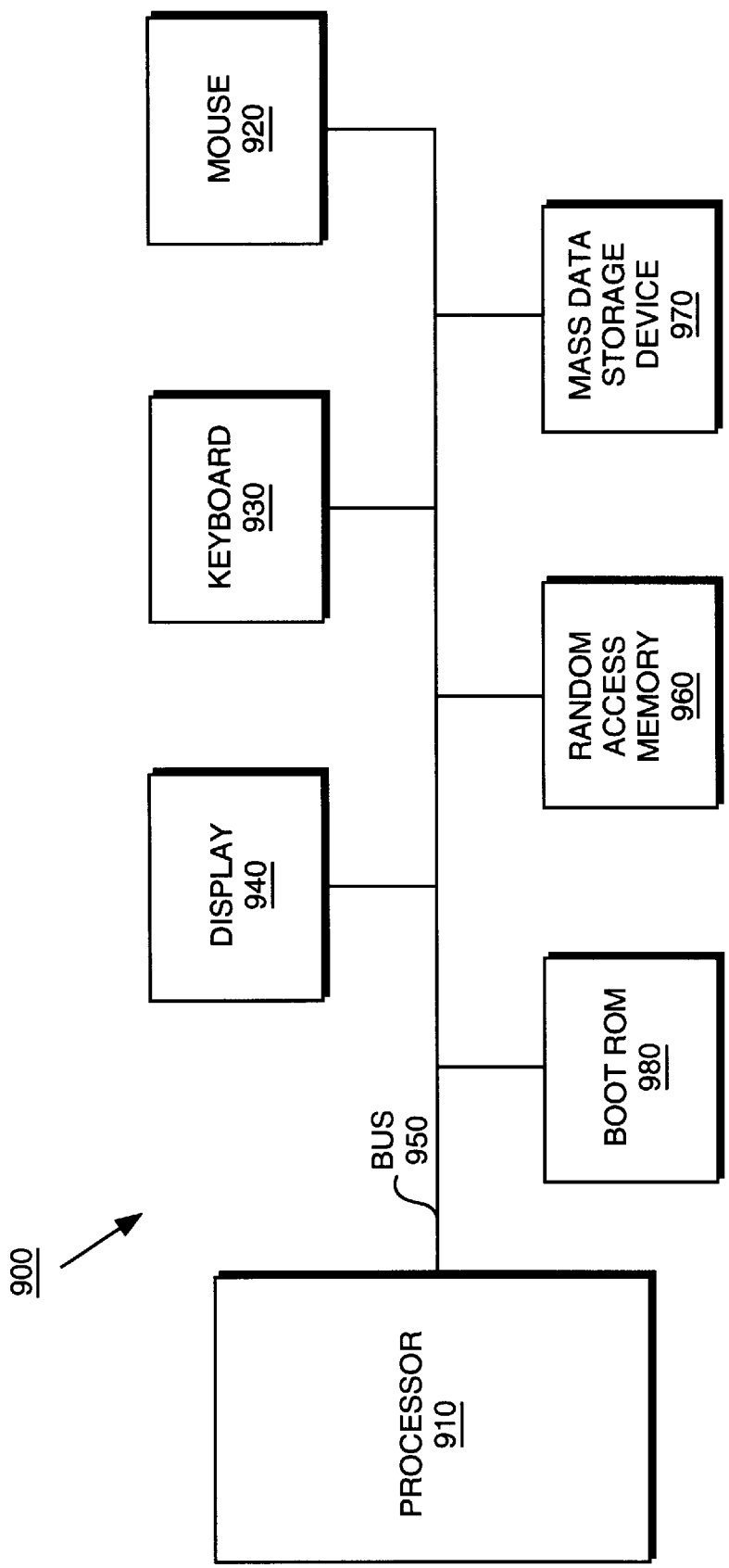
FIG. 9 illustrates one embodiment of a hardware system operative to perform the functions of the present invention.

FIG. 9 is intended to represent a broad category of computer systems including, but not limited to, those based on the Pentium® processor, Pentium® Pro processor, and Pentium® II processor manufactured by and commonly available from Intel Corporation of Santa Clara, Calif. In FIG. 9, processor 910 includes one or more microprocessors. Processor 910 is coupled to random access memory (RAM) 960 and read only memory (ROM) 980 by bus 950. Input/Output devices, including display device 940, keyboard 930, and mouse 920, are also coupled to bus 950. In certain embodiments, one or more components may be eliminated, combined, or rearranged. A number of additional components may also be coupled to bus 950 including, but not limited to, a bus bridge to another bus, one or more disk drives, an internet interface, additional audio/video interfaces, additional memory units, and additional processor units.

Figure 10:
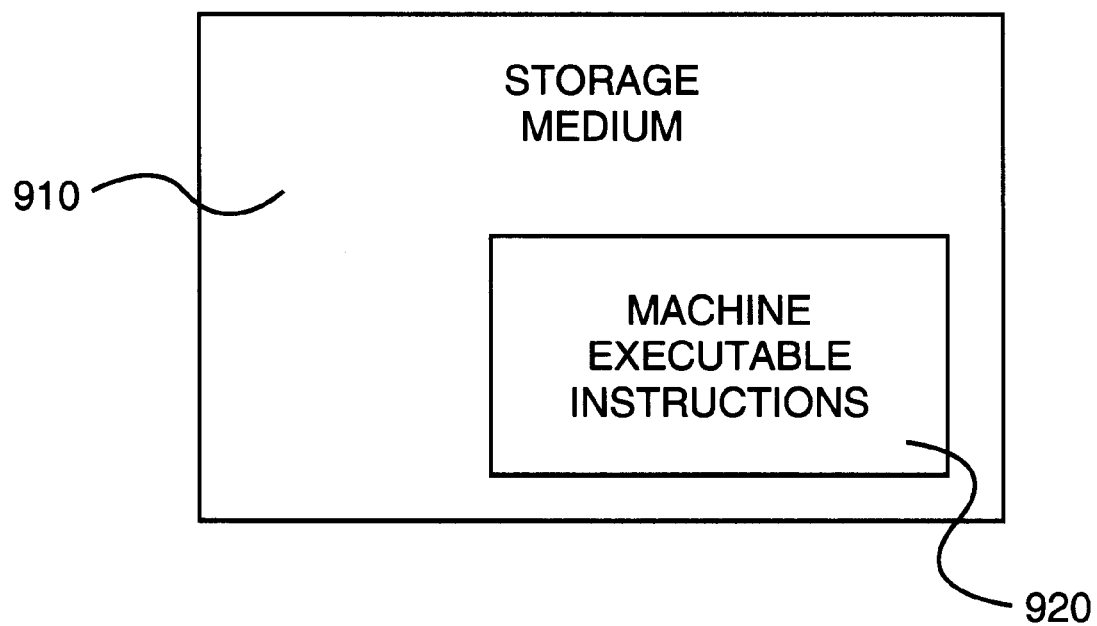
FIG. 10 illustrates one embodiment of a machine readable storage medium having stored thereon machine executable instructions to implement the teachings of the present invention.

The functions of HDL design environment 100, as discussed above, can be executed by processor 910 as a series or sequence of instructions or function calls stored, for instance, in ROM 980 or RAM 960. Alternately, as shown in FIG. 10, the series or sequence of instructions or function calls could be machine executable instructions 920 stored on distribution storage medium 910, such as a CD ROM, a digital video or versatile disk (DVD), or a magnetic storage medium like a floppy disk or tape. The instructions could also be downloaded from a local or remote server.

Alternately, one or more ASICs (application specific integrated circuits) could be endowed with some or all of the functionality of HDL design environment 100 and inserted into system 900 as separate components, or combined with one or more other components.

Thus, a method and apparatus for automatically cross-referencing graphical objects and HDL statements is described. Whereas many alterations and modifications of the present invention will be comprehended by a person skilled in the art after having read the foregoing description, it is to be understood that the particular embodiments shown and described by way of illustration are in no way intended to be considered limiting. Therefore, references to details of particular embodiments are not intended to limit the scope of the claims.

What is claimed is:

1. A method comprising:
    receiving a hardware description language (HDL) graphics view of a first design unit, said HDL graphics view comprising a plurality of graphical objects; and
    automatically generating a cross-referencing record to map the plurality of graphical objects to a corresponding plurality of HDL statements, said plurality of HDL statements comprising a HDL text view of the first design unit.

2. The method of claim 1 wherein automatically generating the cross-referencing record comprises:
    creating a cross-referencing file, said cross-referencing file to cross reference the plurality of graphical objects and the plurality of HDL statements; and
    accessing a library mapping file to map the HDL graphics view to the HDL text view.

3. The method of claim 2 wherein the cross-referencing file comprises a plurality of entries comprising a unique identifier for a particular graphical object within the HDL graphics view and a set of at least one line number for HDL statements, corresponding to the particular graphical object, within the HDL text view.

4. The method of claim 1 wherein automatically generating the cross-referencing record is performed while the HDL text view is generated based on the HDL graphics view.

5. The method of claim 1, wherein receiving the HDL graphics view comprises:
    receiving a library name, a design unit name, and a view name for the HDL graphics view;
    accessing the HDL graphics view based on the library name, design unit name, and view name; and
    retrieving a unique identifier for each of the plurality of graphical objects.

6. The method of claim 5 wherein automatically generating the cross-referencing record comprises:
    identifying a set of at least one line number of HDL statements generated based on each of the plurality of graphical objects; and
    recording entries for each unique identifier and corresponding set of at least one line number.

7. The method of claim 1 wherein automatically generating the cross-referencing record is performed while the HDL graphics view is generated based on the HDL text view.

8. A method comprising:
    receiving a request to cross reference a hardware description language (HDL) statement in a HDL text view of a first design unit and a graphical object in a HDL graphics view of the first design unit;
    accessing a cross-referencing record based on the request; and
    identifying a target of the request based on the accessing.

9. The method of claim 8 wherein the request comprises one of:
    a pathname for the HDL text view and a line number for the HDL statement; and a library, design unit, and view name for the HDL graphics view and a unique identifier for the graphical object.

10. The method of claim 8 wherein the request is based on one of a selection of the HDL statement in a text editor, a selection of the graphical object in a graphics editor, and a message received from one of a HDL generator, a synthesis unit, a simulation unit, and a co-verification unit.

11. The method of claim 8 wherein accessing the cross-referencing record comprises:

accessing a library mapping file;

locating a cross-referencing file for the HDL graphics view and the HDL text view using at least one of the library mapping file and a pathname for the HDL text view or a library, design unit, and view name for the HDL graphics view indicated by the request; and scanning the cross-referencing file for an entry containing a unique identifier of the graphical object or a line number of the HDL statement indicated by the request.

12. The method of claim 11 wherein identifying the target of the request comprises:

retrieving from the entry a target line number or a target unique identifier corresponding to the unique identifier or the line number indicated by the request; and retrieving a target pathname or a target library, design unit, and view based on the library mapping file.

13. The method of claim 8 further comprising:

activating an appropriate editor;

displaying the identified target in the appropriate editor; and designating the identified target in the appropriate editor.

14. The method of claim 13 wherein designating the identified target comprises at least one of:

highlighting the identified target;

centering the identified target; and zooming in on the identified target.

15. An apparatus comprising:

a storage unit to store a hardware description language (HDL) graphics view of a first design unit, said HDL graphics view comprising a plurality of graphical objects; and a generation unit, to receive the HDL graphics view and generate a cross-referencing record to map the plurality of graphical objects to a corresponding plurality of HDL statements, said plurality of HDL statements comprising a HDL text view of the first design unit.

16. The apparatus of claim 15 the cross-referencing record comprises:

a cross-referencing file to cross reference the plurality of graphical object and the plurality of HDL statements; and a library mapping file to map the HDL graphical view to the HDL text view.

17. A cross-referencing apparatus comprising:

first circuitry to receive a request to cross reference a hardware description language (HDL) statement in a HDL text view of a first design unit and a graphical object in a HDL graphics view of the first design unit;

second circuitry to access a cross-referencing record based on the request; and third circuitry to identify a target of the request based on the cross-referencing record.

18. The cross-referencing apparatus of claim 17 further comprising:

fourth circuitry to activate an appropriate editor;

fifth circuitry to display the identified target in the appropriate editor; and sixth circuitry to designate the identified target in the appropriate editor.

19. A machine readable storage medium having stored thereon machine executable instruction, execution of said machine executable instructions to implement a method comprising:

receiving a hardware description language (HDL) graphics view of a first design unit, said HDL graphics view comprising a plurality of graphical objects; and automatically generating a cross-referencing record to map the plurality of graphical objects to a corresponding plurality of HDL statements, said plurality of HDL statements comprising a HDL text view of the first design unit.

20. A machine readable storage medium having stored thereon machine executable instruction, execution of said machine executable instructions to implement a method comprising:

receiving a request to cross reference a hardware description language (HDL) statement in a HDL text view of a first design unit and a graphical object in a HDL graphics view of the first design unit;

accessing a cross-referencing record based on the request; and identifying a target of the request based on the accessing.

* * * * *